US008253459B2

United States Patent
Cho et al.

(10) Patent No.: US 8,253,459 B2
(45) Date of Patent: Aug. 28, 2012

(54) FREQUENCY ADJUSTING APPARATUS AND DLL CIRCUIT INCLUDING THE SAME

(75) Inventors: Kwang Jun Cho, Ichon (KR); Jun Hyun Chun, Ichon (KR)

(73) Assignee: SK hynix Inc. (KR)

( * ) Notice: Subject to any disclaimer, the term of this patent is extended or adjusted under 35 U.S.C. 154(b) by 0 days.

(21) Appl. No.: 13/083,247

(22) Filed: Apr. 8, 2011

(65) Prior Publication Data
US 2011/0181328 A1 Jul. 28, 2011

Related U.S. Application Data

(62) Division of application No. 11/966,300, filed on Dec. 28, 2007, now abandoned.

(51) Int. Cl.
*H03L 7/06* (2006.01)

(52) U.S. Cl. ........................................................ 327/158

(58) Field of Classification Search ........................ None
See application file for complete search history.

(56) References Cited

U.S. PATENT DOCUMENTS

| | | | |
|---|---|---|---|
| 6,600,355 B1 | 7/2003 | Nguyen | |
| 6,813,197 B2 | 11/2004 | Park | |
| 6,989,700 B2 | 1/2006 | Kim | |
| 7,002,380 B2 | 2/2006 | De Gouy et al. | |
| 7,078,950 B2 | 7/2006 | Johnson | |
| 7,103,133 B2 | 9/2006 | Jung | |
| 7,154,311 B2 | 12/2006 | Lim | |
| 7,170,313 B2 | 1/2007 | Shin | |
| 7,236,040 B2 | 6/2007 | Chan et al. | |
| 7,277,357 B1 * | 10/2007 | Ma et al. | 365/233.12 |
| 7,280,412 B2 | 10/2007 | Jang et al. | |
| 7,839,191 B2 * | 11/2010 | Takai | 327/158 |
| 2005/0001663 A1 | 1/2005 | Lee | |
| 2005/0237093 A1 | 10/2005 | Wilhite et al. | |
| 2006/0044033 A1 * | 3/2006 | Kim | 327/158 |
| 2006/0250859 A1 | 11/2006 | Bell et al. | |
| 2006/0267649 A1 | 11/2006 | Park et al. | |

FOREIGN PATENT DOCUMENTS

| | | |
|---|---|---|
| JP | 2000-124796 | 4/2000 |
| JP | 2002314414 | 10/2002 |
| JP | 2005-251370 | 9/2005 |
| JP | 2007-006157 | 1/2007 |
| JP | 2007129306 | 5/2007 |
| KR | 1020040037585 | 5/2004 |
| KR | 1020040095956 | 11/2004 |
| KR | 1020070081084 | 8/2007 |

OTHER PUBLICATIONS

Fujitsu Semiconductor Data Sheet DS04-29116-1 E, Spread Spectrum Clock Generator.
Huang, et al., "A 64 MHz 1920 MHz Programmable Spread-Spectrum Clock Generator," 2005 IEEE.
Damphousse, et al. "All Digital Spread Spectrum Clock Generator for EMI Reduction," 2007 IEEE.
Renesas, "ICs for SSCG Clock Generator 151TS Series".

* cited by examiner

*Primary Examiner* — Lincoln Donovan
*Assistant Examiner* — Sibin Chen
(74) *Attorney, Agent, or Firm* — Baker & McKenzie LLP (57) ABSTRACT

A frequency adjusting apparatus includes a frequency control signal generating unit that generates a multi-bit frequency control signal, which is changed in level bit by bit, in response to a reference clock signal, and a frequency adjusting unit that adjusts the frequency of the reference clock signal in response to the multi-bit frequency control signal.

8 Claims, 13 Drawing Sheets

FREQUENCY ADJUSTING APPARATUS AND DLL CIRCUIT INCLUDING THE SAME

CROSS-REFERENCE TO RELATED PATENT APPLICATION

This is a divisional application of U.S. patent application Ser. No. 11/966,300 filed Dec. 28, 2007 entitled "Frequency adjusting apparatus and DLL circuit including the same" which claims the benefit under 35 U.S.C 119(a) of Korean Patent Application No. 10-2007-0056965, filed on Jun. 11, 2007, and No. 10-2007-0089885, filed on Sep. 5, 2007, in the Korean Intellectual Property Office, the disclosures of which are incorporated herein in their entirety by reference as if set forth in full.

BACKGROUND

1. Technical Field

The embodiments described herein relate to semiconductor integrated circuits and, in particular, to a frequency adjusting apparatus that can reduce electromagnetic interference and a DLL circuit including the same.

2. Related Art

A DLL (delay locked loop) circuit provided in a conventional semiconductor integrated circuit is used to provide an internal clock signal having a phase that leads the phase of a reference clock signal obtained by buffering an external clock signal by a predetermined amount of time. When an internal clock signal used in the semiconductor integrated circuit is delayed by a clock signal buffer and a transmission line, a phase difference between the external clock signal and the internal clock signal occurs, which increases the data access time to output data. The DLL circuit is used to solve this problem.

A conventional DLL circuit controls the phase of the internal clock signal to lead the phase of the external clock signal by a predetermined amount of time to widen such an effective data output period. In recent years, as a high-speed and highly integrated semiconductor integrated circuits are needed, electromagnetic interference (EMI) is attracting attention as a matter of great importance. The electromagnetic interference remarkably occurs when each clock signal or each signal has a prescribed, accurate frequency; however, to date, there is no technology that can solve such a problem.

SUMMARY

A frequency adjusting apparatus that reduces electromagnetic interference in a semiconductor integrated circuit, and a DLL circuit including the same are described herein.

According to one aspect, a frequency adjusting apparatus includes a frequency control signal generating unit that generates a mufti-bit frequency control signal, which is changed in level bit by bit, in response to a reference clock signal, and a frequency adjusting unit that adjusts the frequency of the reference clock signal in response to the mufti-bit frequency control signal.

According to another aspect, a frequency adjusting apparatus includes a frequency control signal generating unit that divides the frequency of a reference clock signal by a plurality of division ratios, thereby generating a mufti-bit frequency control signal, and a frequency adjusting unit that adjusts the frequency of the reference clock signal in response to the multi-bit frequency control signal.

According to still another aspect, a frequency adjusting method includes dividing a frequency of a reference clock signal by a predetermined ratio, thereby generating a divided clock signal, cyclically changing the logical value of a multi-bit frequency control signal in response to the divided clock signal, and applying, to the reference clock signal, a delay time corresponding to the logical value of the multi-bit frequency control signal.

According to yet another aspect, a DLL circuit includes a frequency adjusting apparatus that cyclically increases or decreases the frequency of a reference clock signal, thereby generating a frequency-adjusted clock signal, a delay apparatus that delays the frequency-adjusted clock signal in response to a delay control signal, thereby generating a delayed clock signal, a delay compensating apparatus that applies a delay time, which is obtained by modeling a delay amount on an output path of the delayed clock signal, to the delayed clock signal, thereby generating a feedback clock signal, a phase comparing apparatus that compares the phase of the reference clock signal with the phase of the feedback clock signal, thereby generating a phase comparison signal, and a delay control apparatus that generates the delay control signal in response to the phase comparison signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
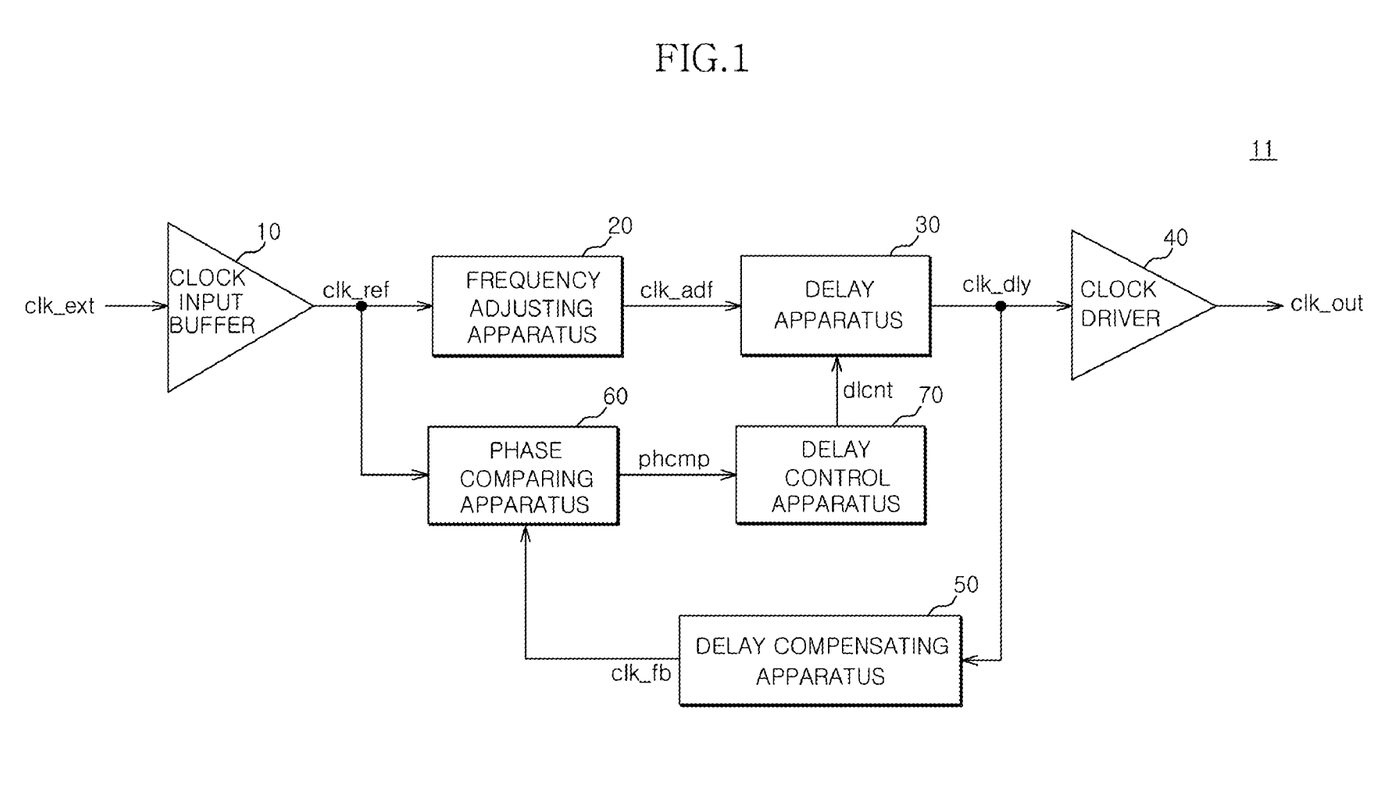
FIG. 1 is a block diagram showing a DLL circuit according to one embodiment.

FIG. 1 is a diagram illustrating an example DLL circuit 11 configured in accordance with one embodiment. Referring to FIG. 1, the DLL circuit 11 can include a clock signal input buffer 10, a frequency adjusting apparatus 20, a delay apparatus 30, a clock signal driver 40, a delay compensating apparatus 50, a phase comparing apparatus 60, and a delay control apparatus 70.

The clock signal input buffer 10 can be configured to buffer an external clock signal 'clk_ext' and to generate a reference clock signal 'clk_ref'. The frequency adjusting apparatus 20 can be configured to cyclically increase or decrease the frequency of the reference clock signal 'clk_ref' to generate a frequency-adjusted clock signal 'clk_adf'. The delay apparatus 30 can be configured to delay the frequency-adjusted clock signal 'clk_adf' in response to a delay control signal 'dlcnt' to generate a delayed clock signal 'clk_dly'. The clock signal driver 40 can be configured to drive the delayed clock signal 'clk_dly' to generate an output clock signal 'clk_out'.

The delay compensating apparatus 50 can be configured to model delay values of delay elements on an output path of the delayed clock signal 'clk_dly' to a data output buffer, and apply a corresponding delay to the delayed clock signal 'clk_dly', to thereby generate the feedback clock signal 'clk_fb'. The phase comparing apparatus 60 can be configured to generate a phase comparison signal 'phcmp' that includes information about which of the reference clock signal 'clk_ref' and the feedback clock signal 'clk_fb' has a more advanced phase and transmit the phase comparison signal 'phcmp' to the delay control apparatus 70. The delay control apparatus 70 can be configured to generate the delay control signal 'dlcnt' according to the information transmitted along with the phase comparison signal 'phcmp' and transmit the generated delay control signal 'dlcnt' to the delay apparatus 30, to thereby control a delay amount, which is applied to the reference clock signal 'clk_ref' by the delay apparatus 30.

If a clock signal that is input to the delay apparatus 30 accurately maintains a prescribed frequency, electromagnetic interference can occur in the delay apparatus 30 and the DLL circuit. The electromagnetic interference leads to an adverse effect, such as signal interference. Thus, the frequency adjusting apparatus 20 can be provided. As mentioned, the frequency adjusting apparatus 20 can be configured to cyclically increase or decrease the frequency of the reference clock signal 'clk_ref'. With the operation of the frequency adjusting apparatus 20, the electromagnetic interference in the delay apparatus 30 and the DLL circuit 11 can be reduced.

Figure 2:
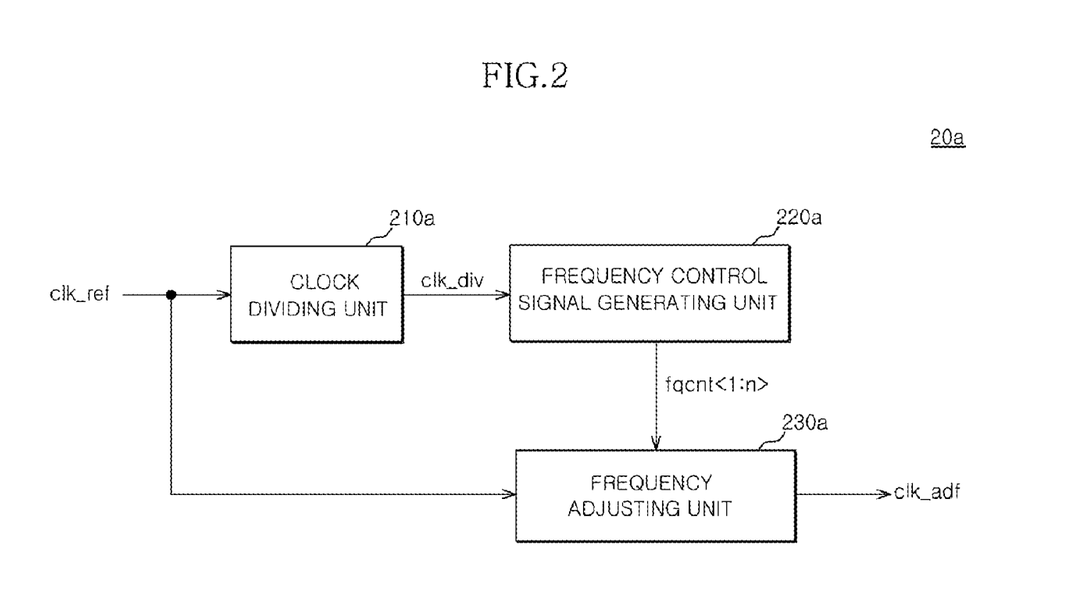
FIG. 2 is a diagram showing a first example of a frequency adjusting apparatus that can be included in the circuit shown in FIG. 1.

FIG. 2 is a diagram illustrating an example of the frequency adjusting apparatus 20a in accordance with one embodiment. Referring to FIG. 2, the frequency adjusting apparatus 20a can include a clock signal dividing unit 210a, a frequency control signal generating unit 220a, and a frequency adjusting unit 230a.

The clock signal dividing unit 210a can be configured to divide the frequency of the reference clock signal 'clk_ref' by a predetermined ratio to generate a divided clock signal 'clk_div'. The division ratio (for example, divide-by-two, divide-by-four, divide-by-eight, or the like) of the reference clock signal 'clk_ref' can be selected based on the requirements of a particular implementation. An optimum time interval to adjust the frequency of the reference clock signal 'clk_ref' should be set through a test, and the division ratio of the reference clock signal 'clk_ref' should be selected based thereon.

Subsequently, the frequency control signal generating unit 220a can be configured to generate an n-bit frequency control signal 'fqcnt<1:n>', which can be changed in level bit by bit at every toggle timing of the divided clock signal 'clk_div'. That is, the logical value of each bit in the n-bit frequency control signal 'fqcnt<1:n>' can be changed each time the divided clock signal 'clk_div' is toggled.

The frequency adjusting unit 230a can be configured to adjust the frequency of the reference clock signal 'clk_ref' in response to the n-bit frequency control signal 'fqcnt<1:n>' to generate the frequency-adjusted clock signal 'clk_adf'. To this end, the frequency adjusting unit 230a can be configured to delay the reference clock signal 'clk_ref' in response to the n-bit frequency control signal 'fqcnt<1:n>'. That is, the n-bit frequency control signal 'fqcnt<1:n>' can instruct the frequency adjusting unit 230a to cyclically increase or decrease the delay amount of the reference clock signal 'clk_ref', and thus the frequency adjusting unit 230a can increase or decrease the delay amount of the reference clock signal 'clk_ref' according to the change in the logical value of the n-bit frequency control signal 'fqcnt<1:n>'.

Figure 3:
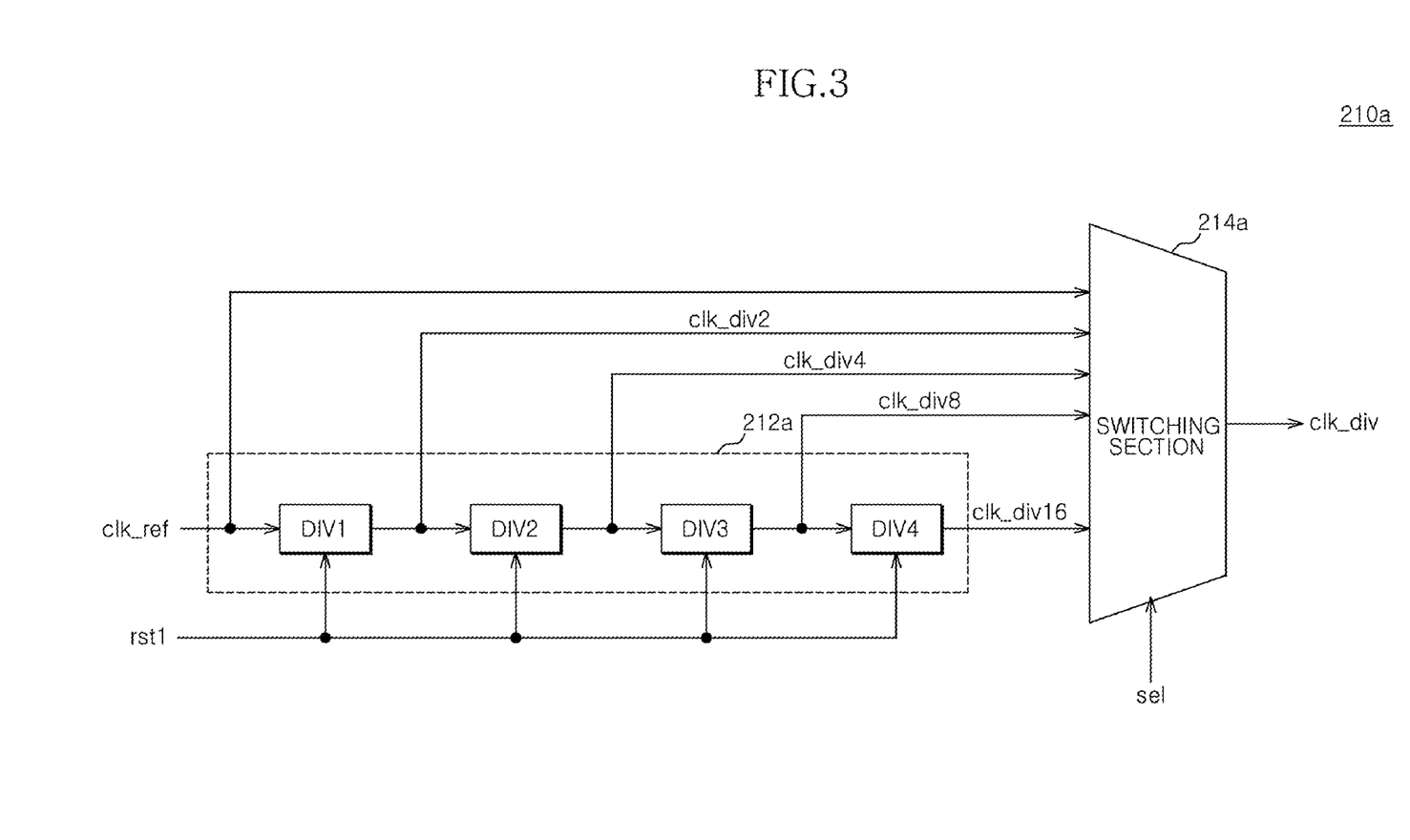
FIG. 3 is a diagram showing the detailed configuration of a clock signal dividing unit that can be included in the apparatus shown in FIG. 2.

FIG. 3 is a diagram showing the detailed configuration of the clock signal dividing unit 210a shown in FIG. 2. Here, the clock signal dividing unit can be configured to output a clock signal that is generated by dividing-by-two, four, eight, and sixteen the reference clock signal 'clk_ref' as the divided clock signal 'clk_div'. It should be noted that in the clock signal dividing unit 210a illustrated in FIG. 3, the division ratio and the number of clock signals to be generated by division are not limited to those shown in drawings.

Referring to FIG. 3, the clock signal dividing unit 210a can include a divided clock signal generating section 212a and a switching section 214a.

The divided clock signal generating section 212a can be configured to generate a divided-by-two clock signal 'clk_div2', a divided-by-four clock signal 'clk_div4', a divided-by-eight clock signal 'clk_div8', and a divided-by-sixteen 'clk_div16' from the reference clock signal 'clk_ref' in response to a first reset signal 'rst1'. The divided clock signal generating section 212a can include a first divider DIV1, a second divider DIV2, a third divider DIV3, and a fourth divider DIV4.

The first divider DIV1 can be configured to divide-by-two the reference clock signal 'clk_ref' in response to the first reset signal 'rst1' to generate the divided-by-two clock signal 'clk_div2'. The second divider DIV2 can be configured to divide-by-two the divided-by-two clock signal 'clk_div2' in response to the first reset signal 'rst1' to generate the divided-by-four clock signal 'clk_div4'. The third divider DIV3 can be configured to divide-by-two the divided-by-four clock signal 'clk_div4' in response to the first reset signal 'rst1' to generate the divided-by-eight clock signal 'clk_div8'. The fourth divider DIV4 can be configured to divide-by-two the divided-by-eight clock signal 'clk_div8' in response to the first reset signal 'rst1' to generate the divided-by-sixteen clock signal 'clk_div16'.

The switching section 214a can be configured to select one of the reference clock signal 'clk_ref', the divided-by-two clock signal 'clk_div2', the divided-by-four clock signal 'clk_div4', the divided-by-eight clock signal 'clk_div8', and the divided-by-sixteen clock signal 'clk_div16' in response to a selection signal 'sel', and output the selected clock signal as the divided clock signal 'clk_div'.

The selection signal 'sel' can, e.g., be implemented by a test signal during a test operation. In addition, if the test operation ends, the selection signal 'sel' can, e.g., be implemented by a signal whose level is artificially fixed by a mode register or a fuse circuit. Further, the switching section 214a can be implemented by a multiplexer (MUX) circuit, which is controlled according to the selection signal 'sel'.

Figure 4:
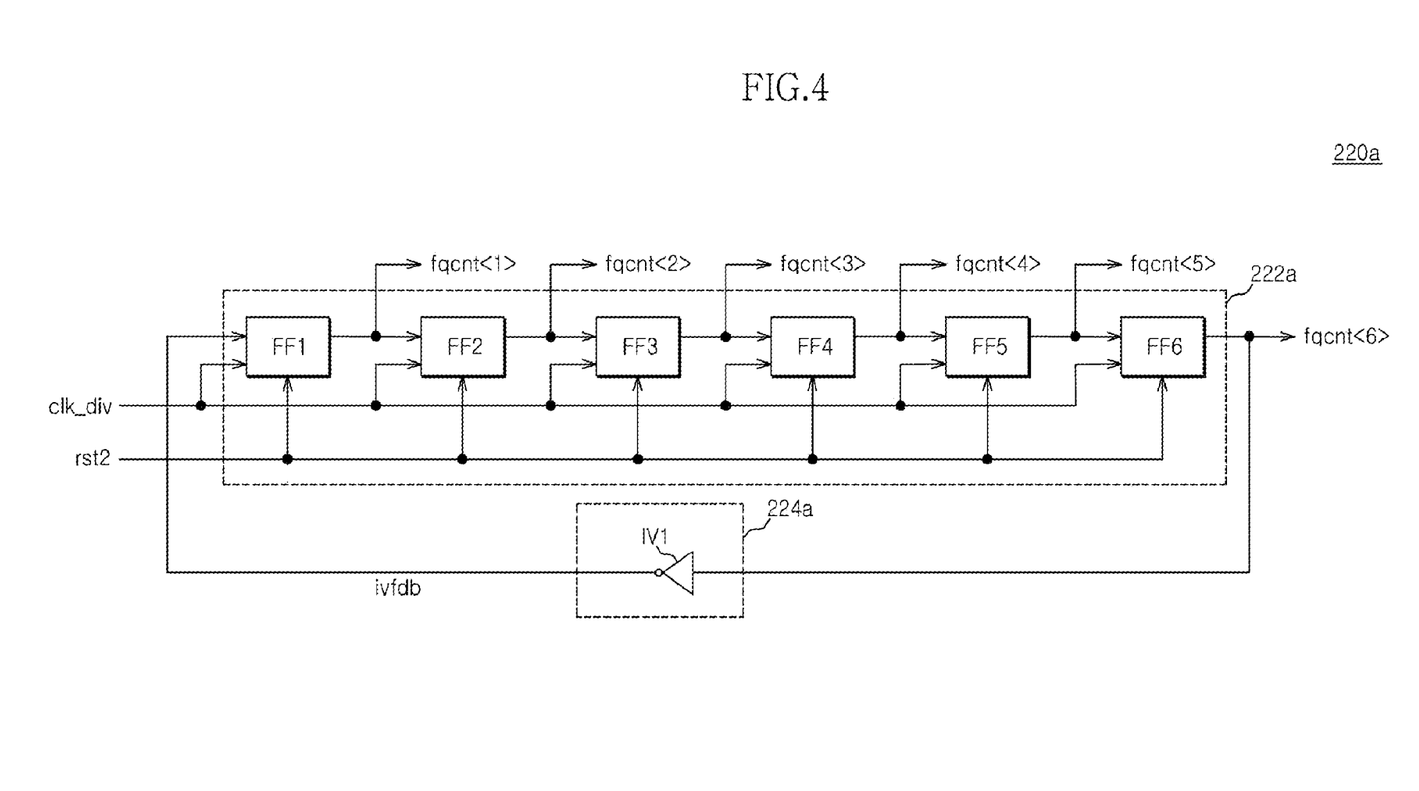
FIG. 4 is a diagram showing the detailed configuration of a frequency control signal generating unit that can be included in the apparatus shown in FIG. 2.

FIG. 4 is a diagram showing the detailed configuration of the frequency control signal generating unit 220a shown in FIG. 2. Here, the frequency control signal is implemented by a 6-bit signal, but it will be understood that the embodiments described herein are not necessarily so limited Referring to FIG. 4, the frequency control signal generating unit 220a can include a shift section 222a and an inverting section 224a.

The shift section 222a can be configured to shift an inverted feedback signal 'ivfdb' and five bits 'fqcnt<1:5>' of the 6-bit frequency control signal 'fqcnt<1:6>' in response to a second reset signal 'rst2' and the divided clock signal 'clk_div', and to adjust the logical value of the 6-bit frequency control signal 'fqcnt<1:6>'. The shift section 222a can include first to sixth flip-flops FF1 to FF6.

The first flip-flop FF1 can be configured to latch the inverted feedback signal 'ivfdb' in response to the second reset signal 'rst2' and the divided clock signal 'clk_div', and to generate a first frequency control signal 'fqcnt<1>'. The second flip-flop FF2 can be configured to latch the first frequency control signal 'fqcnt<1>' in response to the second reset signal 'rst2' and the divided clock signal 'clk_div', and generate a second frequency control signal 'fqcnt<2>'. The third flip-flop FF3 can be configured to latch the second frequency control signal 'fqcnt<2>' in response to the second reset signal 'rst2' and the divided clock signal 'clk_div', and generate a third frequency control signal 'fqcnt<3>'. The fourth flip-flop FF4 can be configured to latch the third frequency control signal 'fqcnt<3>' in response to the second reset signal 'rst2' and the divided clock signal 'clk_div', and generate a fourth frequency control signal 'fqcnt<4>'. The fifth flip-flop FF5 can be configured to latch the fourth frequency control signal 'fqcnt<4>' in response to the second reset signal 'rst2' and the divided clock signal 'clk_div', and generate a fifth frequency control signal 'fqcnt<5>'. The sixth flip-flop FF6 can be configured to latch the fifth frequency control signal 'fqcnt<5>' in response to the second reset signal 'rst2' and the divided clock signal 'clk_div', and generate a sixth frequency control signal 'fqcnt<6>'.

The inverting section 224a can be configured to invert the sixth bit of the 6-bit frequency control signal 'fqcnt<1:6>', that is, the sixth frequency control signal 'fqcnt<6>', and output the inverted bit as the inverted feedback signal 'ivfdb'. The inverting section 224a can include a first inverter IV1 that can be configured to invert the sixth frequency control signal 'fqcnt<6>' and output the inverted feedback signal 'ivfdb'.

In an initial state, if it is assumed that the bits of the 6-bit frequency control signal 'fqcnt<1:6>' are all at a low level, then the inverted feedback signal 'ivfdb' is at a high level. Subsequently, each of the first to sixth flip-flops FF1 to FF6 of the shift section 222a shifts the inverted feedback signal 'ivfdb', which is at a high level, bit by bit in synchronization with the toggle timing of the divided clock signal 'clk_div'. Accordingly, the 6-bit frequency control signal 'fqcnt<1:6>' can be changed in level bit by bit. The change in the level of the frequency control signal 'fqcnt<1:6>' is shown in FIG. 5.

Figure 5:
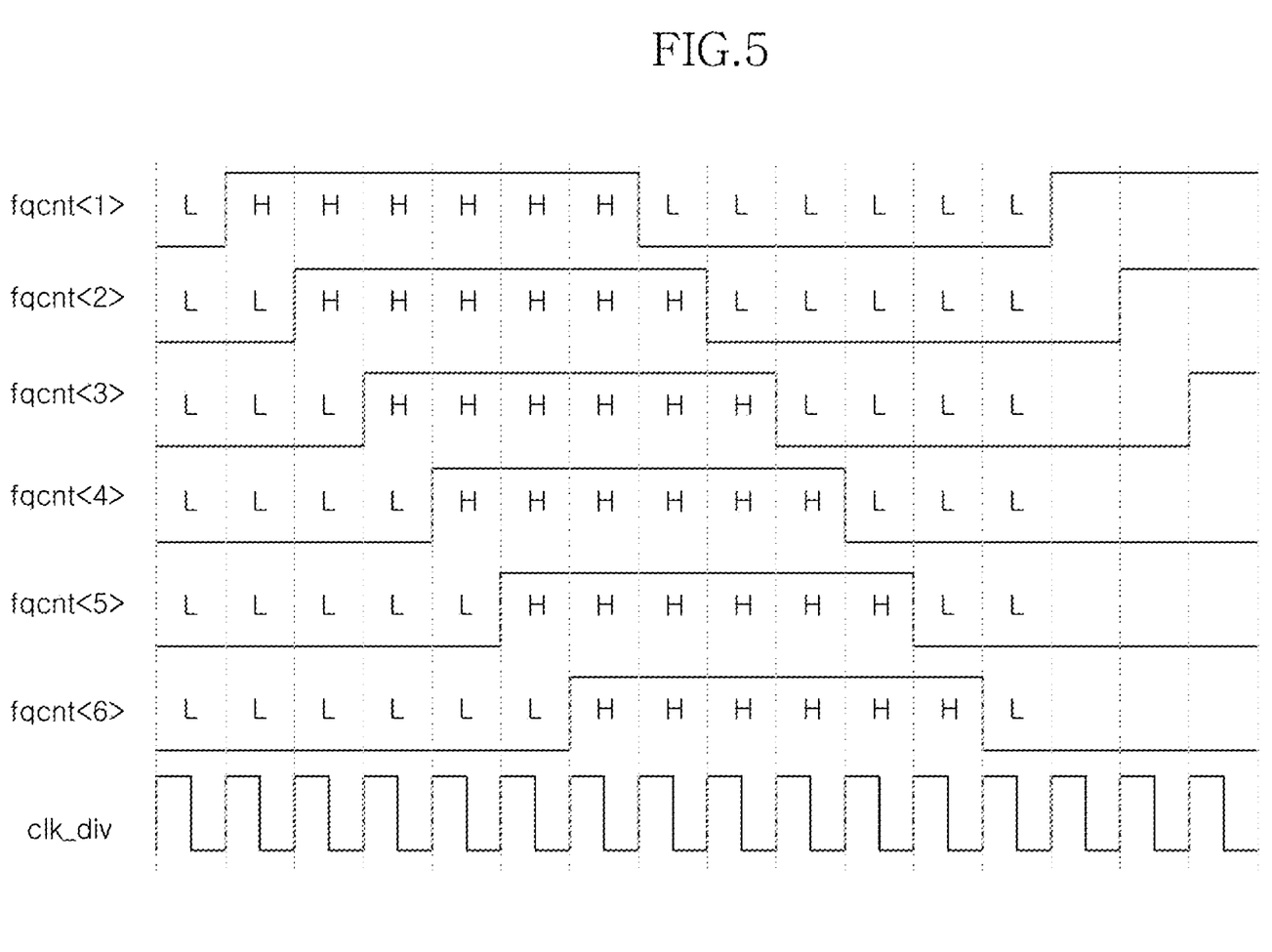
FIG. 5 is a waveform chart of a frequency control signal that is output from the frequency control signal generating unit shown in FIG. 4.

Referring to FIG. 5, it can be seen that the 6-bit frequency control signal 'fqcnt<1:6>' can be changed in level bit by bit from a low level to a high level at every toggle timing of the divided clock signal 'clk_div'. After all the levels of the bits of the 6-bit frequency control signal 'fqcnt<1:6>' go to a high level, the 6-bit frequency control signal 'fqcnt<1:6>' can be changed in level bit by bit again from a high level to a low level. That is, the 6-bit frequency control signal 'fqcnt<1:6>' can be changed in logical value bit by bit at every toggle timing of the divided clock signal 'clk_div'. In this way, the 6-bit frequency control signal 'fqcnt<1:6>' is cyclically changed in level.

Figure 6:
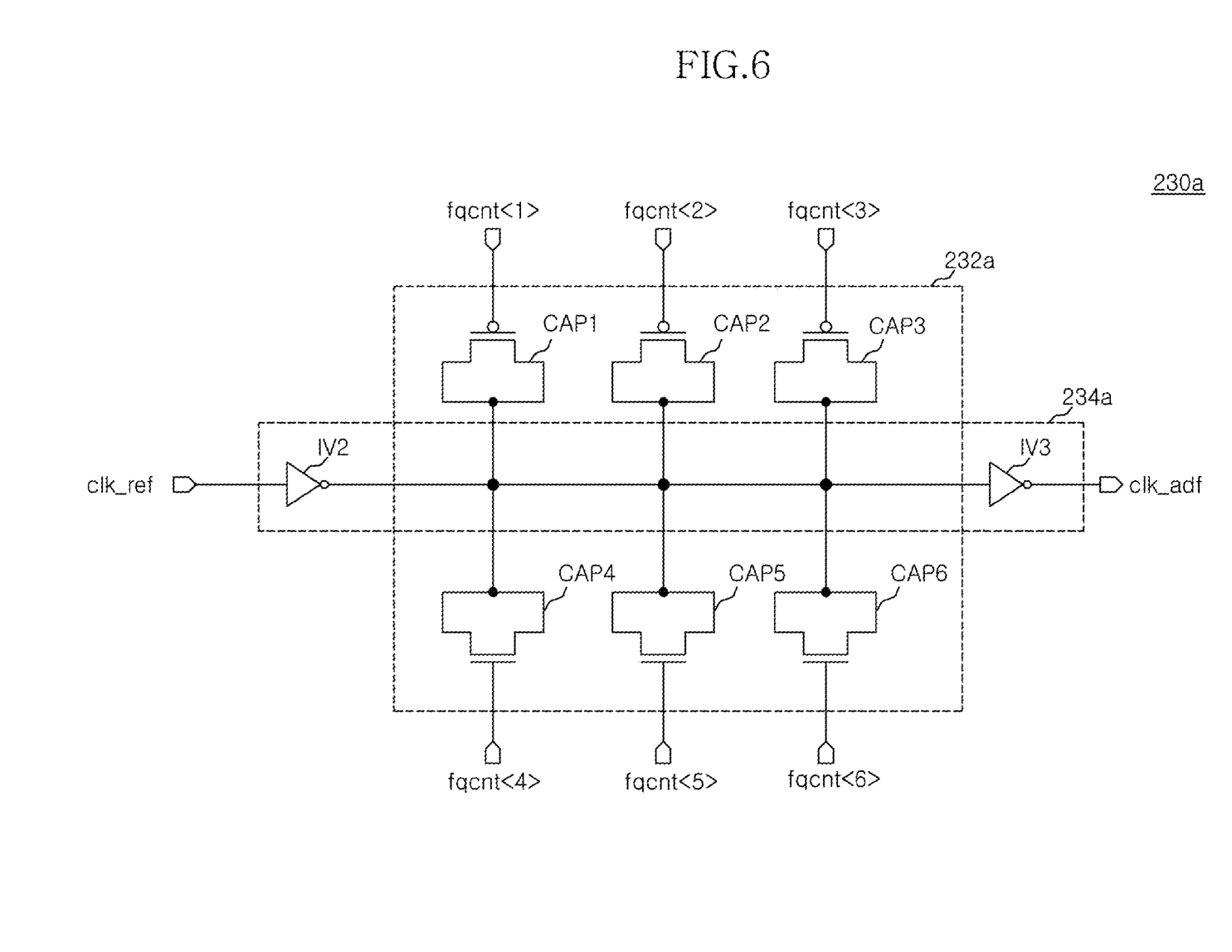
FIG. 6 is a diagram showing the detailed configuration of a frequency adjusting unit that can be included in the apparatus shown in FIG. 2.

FIG. 6 is a diagram showing the detailed configuration of the frequency adjusting unit 230a shown in FIG. 2. Here, the frequency adjusting unit operates in response to the 6-bit frequency control signal 'fqcnt<1:6>'.

Referring to FIG. 6, the frequency adjusting unit 230a can include a driving section 232a that can be configured to drive the reference clock signal 'clk_ref' to generate the frequency-adjusted clock signal 'clk_adf', and a delay section 234a that can be configured to delay the operation of the driving section 232a in response to the 6-bit frequency control signal 'fqcnt<1:6>'.

The driving section 232a can include a second inverter IV2 that can be configured to drive the reference clock signal 'clk_ref', and a third inverter IV3 that can be configured to drive an output signal of the second inverter IV2 to output the frequency-adjusted clock signal 'clk_adf'.

The delay section 234a can include first to sixth capacitors CAP1 to CAP6. Each of the first to sixth capacitors CAP1 to CAP6 can have a first terminal connected between the second inverter IV2 and the third inverter IV3, and a second terminal, to which a corresponding bit of the 6-bit frequency control signal 'fqcnt<1:6>' is input.

As shown in FIG. 6, the first to third capacitors CAP1 to CAP3 can be PMOS-type capacitors, and the fourth to sixth capacitors CAP4 to CAP6 can be NMOS-type capacitors; however, the embodiments described herein are not necessarily so limited In the frequency adjusting unit 230a having the above-described configuration, a delay value of the delay section 234a can be set as a default value when the bits of the 6-bit frequency control signal 'fqcnt<1:6>' are all at a low level. In this case, a delay operation can be performed by the first to third capacitors CAP1 to CAP3. That is, a delay time provided by the three capacitors can be applied to the frequency-adjusted clock signal 'clk_adf'.

Next, if the bits of the 6-bit frequency control signal 'fqcnt<1:6>' starts to be changed in level bit by bit, e.g., from low to high, the first to third capacitors CAP1 to CAP3 of the delay section 234a can be disabled one by one. If the 6-bit frequency control signal 'fqcnt<1:6>' continues to be changed bit by bit to a high level, then after all the first to third capacitors CAP1 to CAP3 are disabled, the fourth to sixth capacitors CAP4 to CAP6 of the delay section 234a can be enabled one by one.

Next, if the 6-bit frequency control signal 'fqcnt<1:6>' is changed in level bit by bit from high to low, then the first to third capacitors CAP1 to CAP3 can be enabled one by one, and the fourth to sixth capacitors CAP4 to CAP6 can be disabled one by one. That is, as the 6-bit frequency control signal 'fqcnt<1:6>' is cyclically changed in level bit by bit, the delay section 234a cyclically increases or decreases the delay of the reference clock signal 'clk_ref', which is driven by the driving section 232a. Therefore, the frequency-adjusted clock signal 'clk_adf' can be implemented by a clock signal whose frequency cyclically increases or decreases. As a result, in the DLL circuit, electromagnetic interference can be reduced, compared with a case where a clock signal having a fixed frequency is used.

Figure 7:
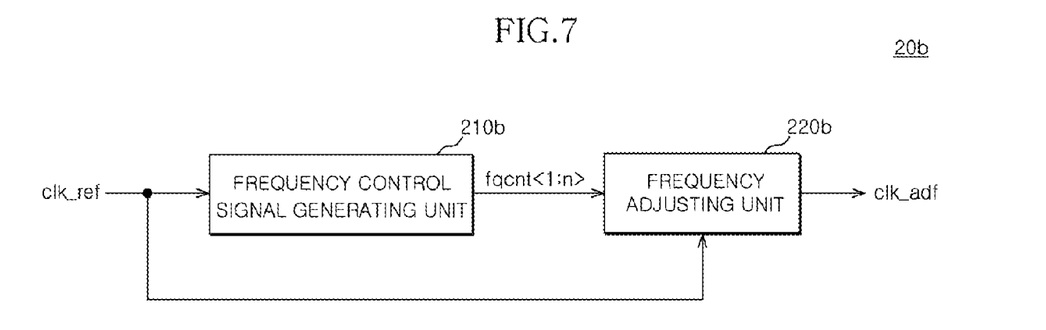
FIG. 7 is a diagram showing a second example of a frequency adjusting apparatus that can be included in the circuit shown in FIG. 1.

FIG. 7 is a diagram illustrating a second example of a frequency adjusting apparatus 20b that can be included in the DLL circuit 11 of FIG. 1.

As can be seen, the frequency adjusting apparatus 20b can include a frequency control signal generating unit 210b and a frequency adjusting unit 220b.

The frequency control signal generating unit 210b can be configured to divide the frequency of the reference clock signal 'clk_ref' by a predetermined division ratio to generate an n-bit frequency control signal 'fqcnt<1:n>'. The logical value of each bit of the n-bit frequency control signal 'fqcnt<1:n>' can be changed in response to the reference clock signal 'clk_ref'.

The frequency adjusting unit 220b can be configured to adjust the frequency of the reference clock signal 'clk_ref' in response to the n-bit frequency control signal 'fqcnt<1:n>' to generate the frequency-adjusted clock signal 'clk_adf'. To this end, the frequency adjusting unit 220b can be configured to delay the reference clock signal 'clk_ref' in response to the n-bit frequency control signal 'fqcnt<1:n>'. That is, the n-bit frequency control signal 'fqcnt<1:n>' can instruct the frequency adjusting unit 220b to cyclically increase or decrease the delay amount of the reference clock signal 'clk_ref', and thus the frequency adjusting unit 220b can increase or decrease the delay amount of the reference clock signal 'clk_ref' according to the change in the logical value of the n-bit frequency control signal 'fqcnt<1:n>'.

Figure 8:
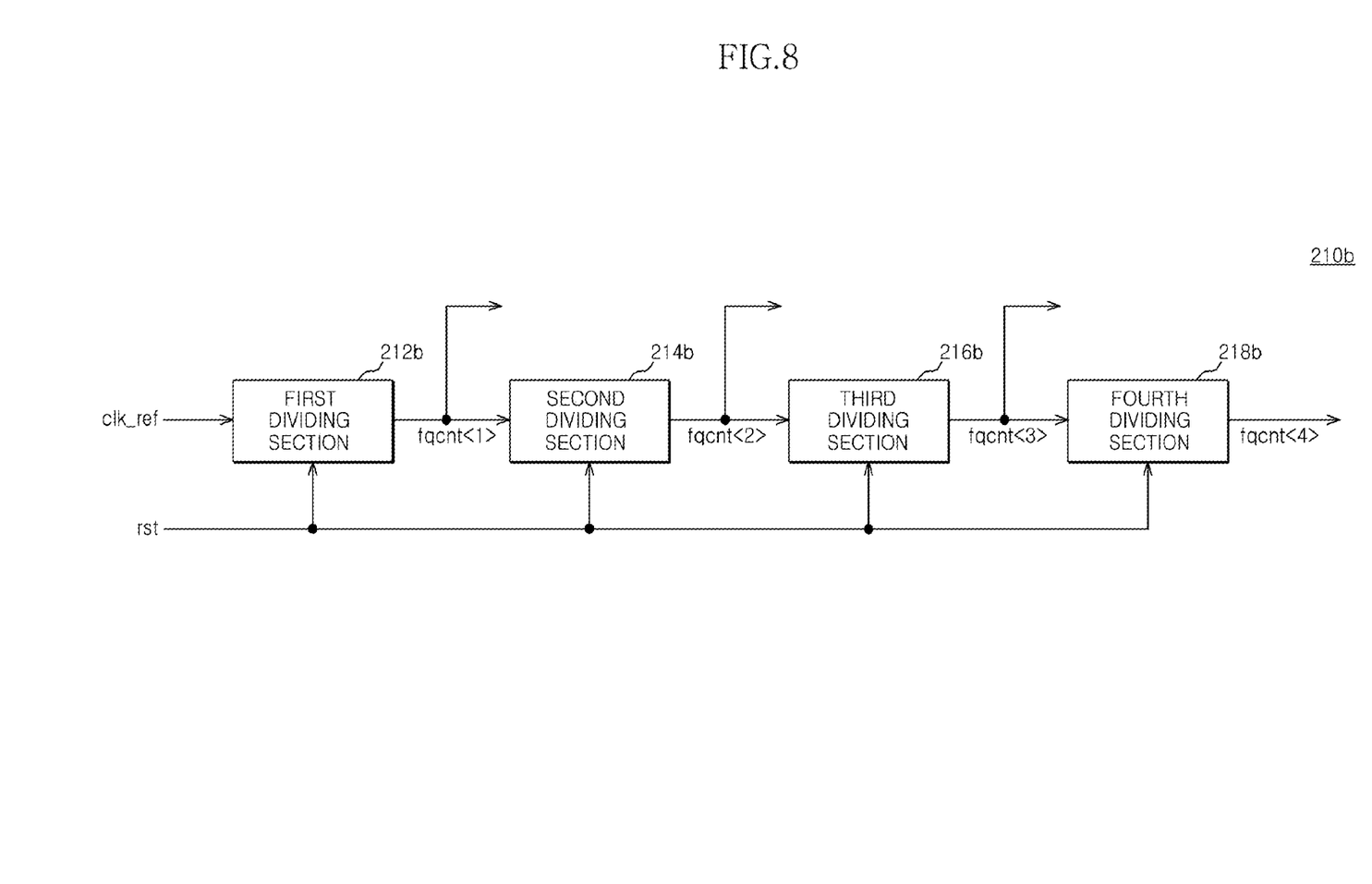
FIG. 8 is a diagram showing the detailed configuration of a frequency control signal generating unit that can be included in the apparatus shown in FIG. 7.

FIG. 8 is a diagram showing the detailed configuration of the frequency control signal generating unit 210b shown in FIG. 7. Here, the frequency control signal is implemented by a 4-bit signal. But the embodiments described herein are not necessarily so limited.

Referring to FIG. 8, the frequency control signal generating unit 210b can include a first dividing section 212b, a second dividing section 214b, a third dividing section 216b, and a fourth dividing section 218b.

The first dividing section 212b can be configured to divide-by-one the reference clock signal 'clk_ref' in response to a reset signal 'rst' to generate a first frequency control signal 'fqcnt<1>'. The second dividing section 214b can be configured to divide-by-two the first frequency control signal 'fqcnt<1>' in response to the reset signal 'rst' to generate a second frequency control signal 'fqcnt<2>'. The third dividing section 216b can be configured to divide-by-two the second frequency control signal 'fqcnt<2> in response to the reset signal 'rst' to generate a third frequency control signal 'fqcnt<3>'. The fourth dividing section 218b can be configured to divide-by-two the third frequency control signal 'fqcnt<3>' in response to the reset signal 'rst' to generate a fourth frequency control signal 'fqcnt<4>'.

With this configuration, the first frequency control signal 'fqcnt<1>' has the same frequency as the reference clock signal 'clk_ref', and the second frequency control signal 'fqcnt<2>' has ½ the frequency of the reference clock signal 'clk_ref'. In addition, the third frequency control signal 'fqcnt<3>' has ¼ of the frequency of the reference clock signal 'clk_ref', and the fourth frequency control signal 'fqcnt<4>' has ⅛ of the frequency of the reference clock signal 'clk_ref'.

Figure 9:
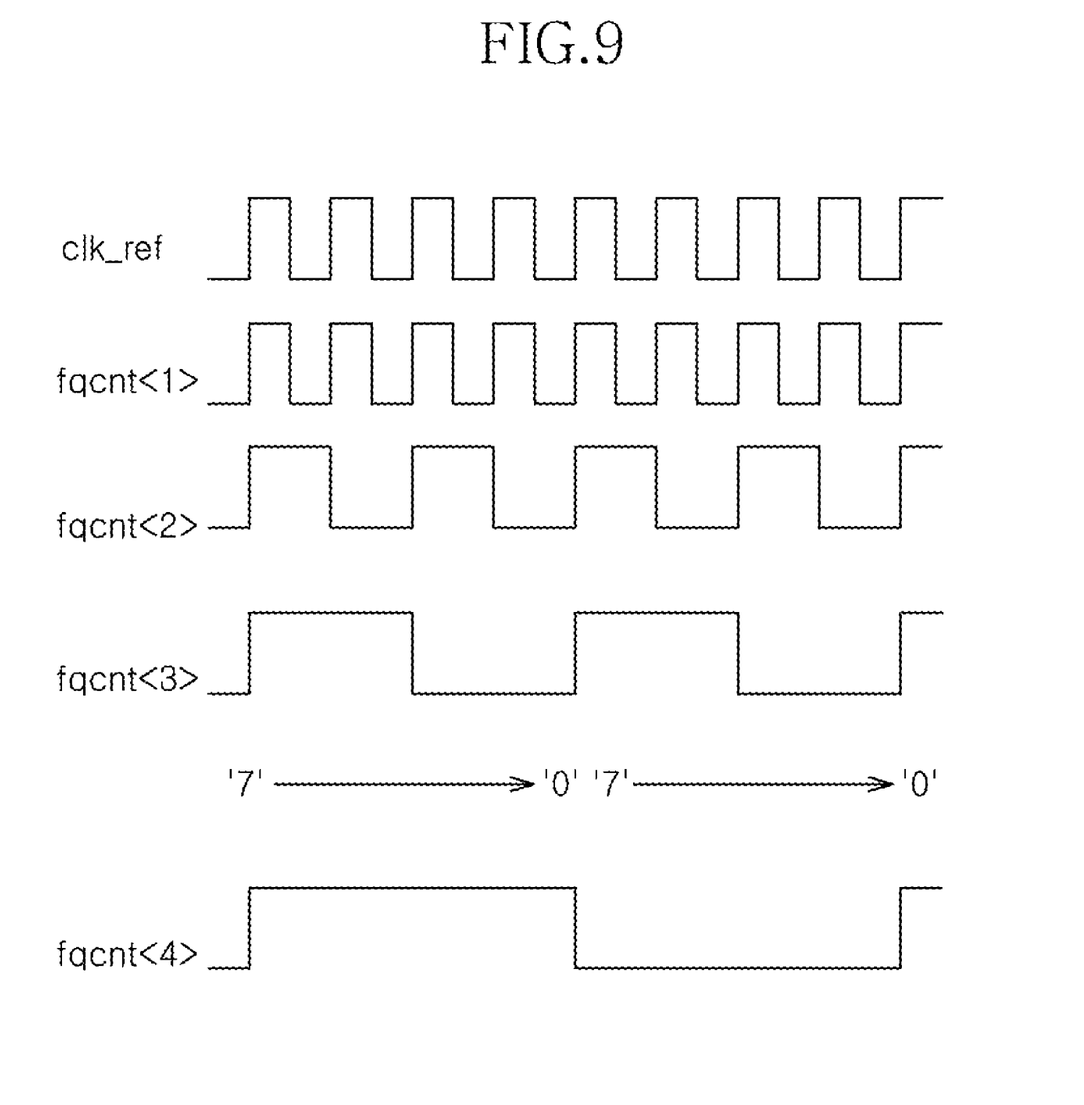
FIG. 9 is a waveform chart of a frequency control signal that is output from the frequency control signal generating unit shown in FIG. 8.

Referring to FIG. 9, it can be seen that the logical value of the 4-bit frequency control signal 'fqcnt<1:4>' can be changed at every toggle timing of the reference clock signal 'clk_ref'. That is, on an assumption that the first frequency control signal 'fqcnt<1>' is the lowermost binary bit, and the third frequency control signal 'fqcnt<3>' is the uppermost binary bit, when the logical value of the 3-bit frequency control signal 'fqcnt<1:3>' is expressed in decimal, the logical value of the 3-bit frequency control signal 'fqcnt<1:3>' repeatedly decreases from 7 to 0. Subsequently, the fourth frequency control signal 'fqcnt<4>' can be used to control the phase of the 3-bit frequency control signal 'fqcnt<1:3>'.

Figure 10:
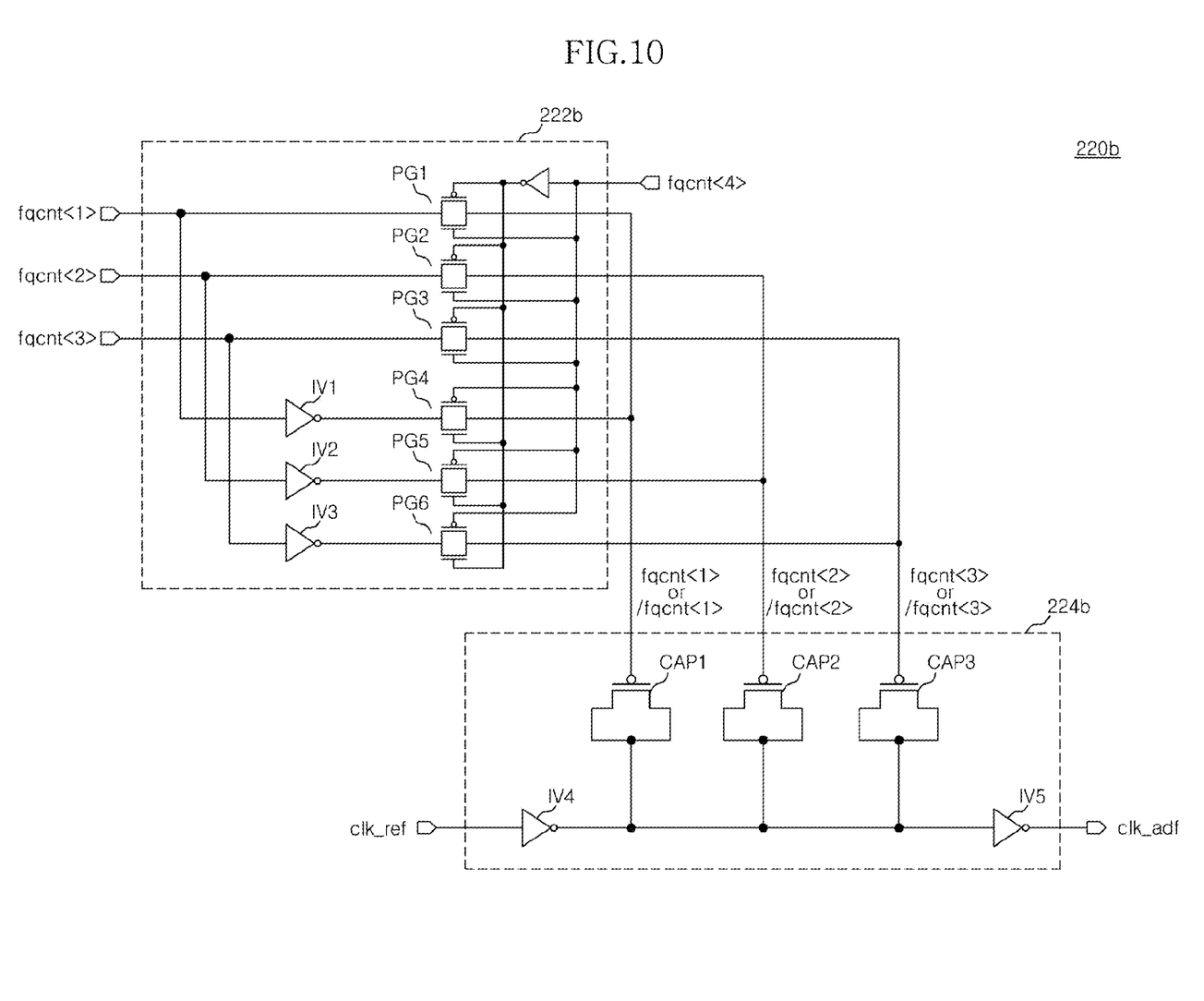
FIG. 10 is a diagram showing the detailed configuration of a frequency adjusting unit that can be included in the apparatus shown in FIG. 7.

FIG. 10 is a diagram showing the detailed configuration of the frequency adjusting unit 220b shown in FIG. 7. Here, the frequency adjusting unit can be configured to operate in response to the 4-bit frequency control signal 'fqcnt<1:4>'.

Referring to FIG. 10, the frequency adjusting unit 220b can include a switching section 222b and a delay section 224b.

The switching section 222b can be configured to selectively invert the first to third frequency control signals 'fqcnt<1:3>' in response to the fourth frequency control signal 'fqcnt<4>' and output the first to third frequency control signals 'fqcnt<1:3>' or negative first to third frequency control signals '/fqcnt<1:3>'. The switching section 222b can include first to sixth pass gates PG1 to PG6, and first to third inverters IV1 to IV3.

The first to third pass gates PG1 to PG3 can be configured to pass the first to third frequency control signals 'fqcnt<1:3>', respectively, when the fourth frequency control signal 'fqcnt<4>' is at a high level. The first to third inverters IV1 to IV3 can be configured to invert the first to third frequency control signals 'fqcnt<1:3>' and output the first to third negative frequency control signals '/fqcnt<1:3>', respectively. The fourth to sixth pass gates PG4 to PG6 can be configured to pass the first to third negative frequency control signals '/fqcnt<1:3>', respectively, when the fourth frequency control signal 'fqcnt<4>' is at a low level.

The delay section 224b can be configured to delay the reference clock signal 'clk_ref' in response to the first to third frequency control signals 'fqcnt<1:3>' or the first to third negative frequency control signals '/fqcnt<1:3>'. The delay section 224b can include fourth and fifth inverters IV4 and IV5, and first to third capacitors CAP1 to CAP3.

The fourth inverter IV4 can receive the reference clock signal 'clk_ref'. The fifth inverter IV5 can receive an output signal of the fourth inverter IV4 and output the frequency-adjusted clock signal 'clk_adf'. Each of the first to third capacitors CAP1 to CAP3 can have a first terminal connected between the fourth inverter IV4 and the fifth inverter IV5, and a second terminal, to which a corresponding one of the first to third frequency control signals '/fqcnt<1:3>' or a corresponding one of the first to third negative frequency control signals' /fqcnt<1:3> is input.

Here, the first to third capacitors CAP1 to CAP3 are implemented by PMOS-type capacitors, but even if NMOS-type capacitors are used, the same operation can be performed.

The third capacitor CAP3 can have capacitance two times higher than the second capacitor CAP2, and the second capacitor CAP2 can have capacitance two times higher than the first capacitor CAP1.

In the frequency adjusting unit 220b having the above-described configuration, when the fourth frequency control signal 'fqcnt<4>' is at the high level, the first to third frequency control signals 'fqcnt<1:3>' are correspondingly input to the first to third capacitors CAP1 to CAP3 of the delay section 224b. At this time, if the first to third frequency control signals 'fqcnt<1:3>' are all at a high level, then the delay amount that is applied to the reference clock signal 'clk_ref' by the delay section 224b can be minimized. Subsequently, the logical values of the first to third frequency control signals 'fqcnt<1:3>' can be changed, for example, from 7 to 0 when being expressed in decimal as described above, and as a result, the delay amount that is applied to the reference clock signal 'clk_ref' by the delay section 224b can be increased.

After the delay amount that is applied to the reference clock signal 'clk_ref' by the delay section 224b is maximized, the fourth frequency control signal 'fqcnt<4>' can be changed to the low level. Then, the first to third negative frequency control signals '/fqcnt<1:3>' are correspondingly input to the first to third capacitors CAP1 to CAP3 of the delay section 224b. Since the logical values of the first to third negative frequency control signals '/fqcnt<1:3>' are changed from 0 to 7 in decimal, and as a result, the delay amount that is applied to the reference clock signal 'clk_ref' by the delay section 224b can be decreased. This is because the first to third capacitors CAP1 to CAP3 have a capacitance ratio, similar to the frequency ratio between the first to third frequency control signals 'fqcnt<1:3>'.

As such, as the 4-bit frequency control signal 'fqcnt<1:4>' cyclically increases or decreases the delay amount by the delay section 224b, the frequency-adjusted clock signal 'clk_adf' can be implemented by a clock signal whose frequency cyclically increases or decreases. As a result, in the DLL circuit 11, electromagnetic interference can be reduced, compared with a case where a clock signal having a fixed frequency is used.

Figure 11A:
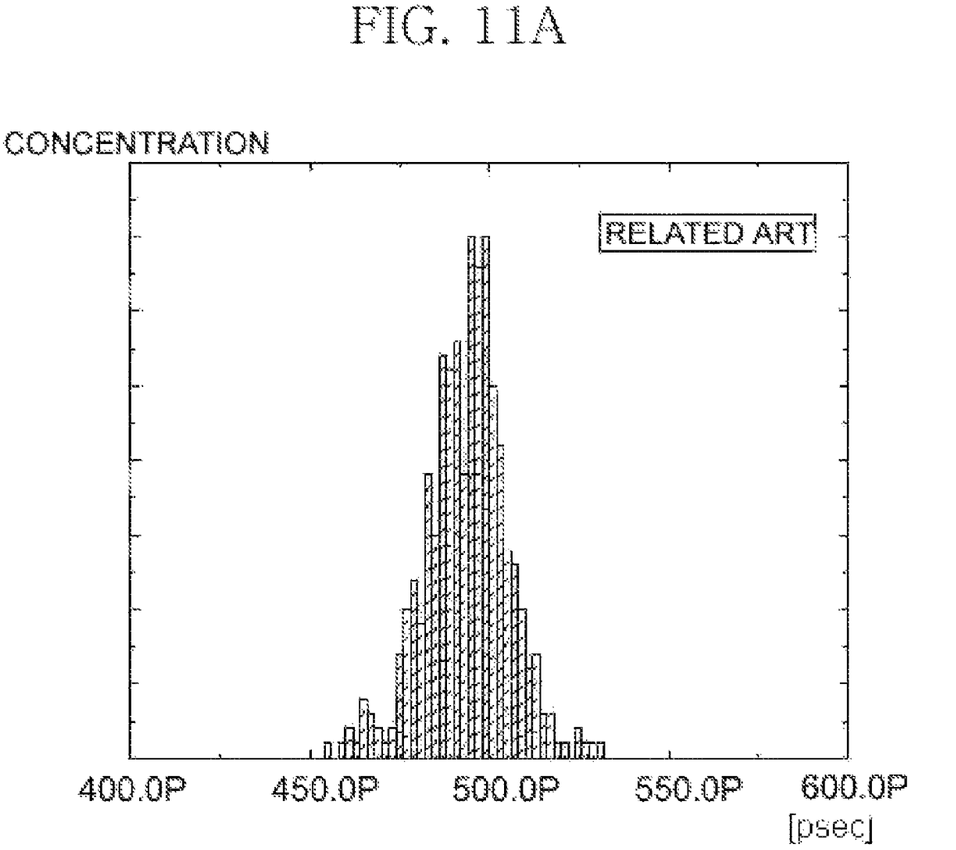
FIGS. 11A, 11B, and 12 are diagrams illustrating the operation of a DLL circuit according to the embodiments of FIGS. 1-10.
Figure 11B:
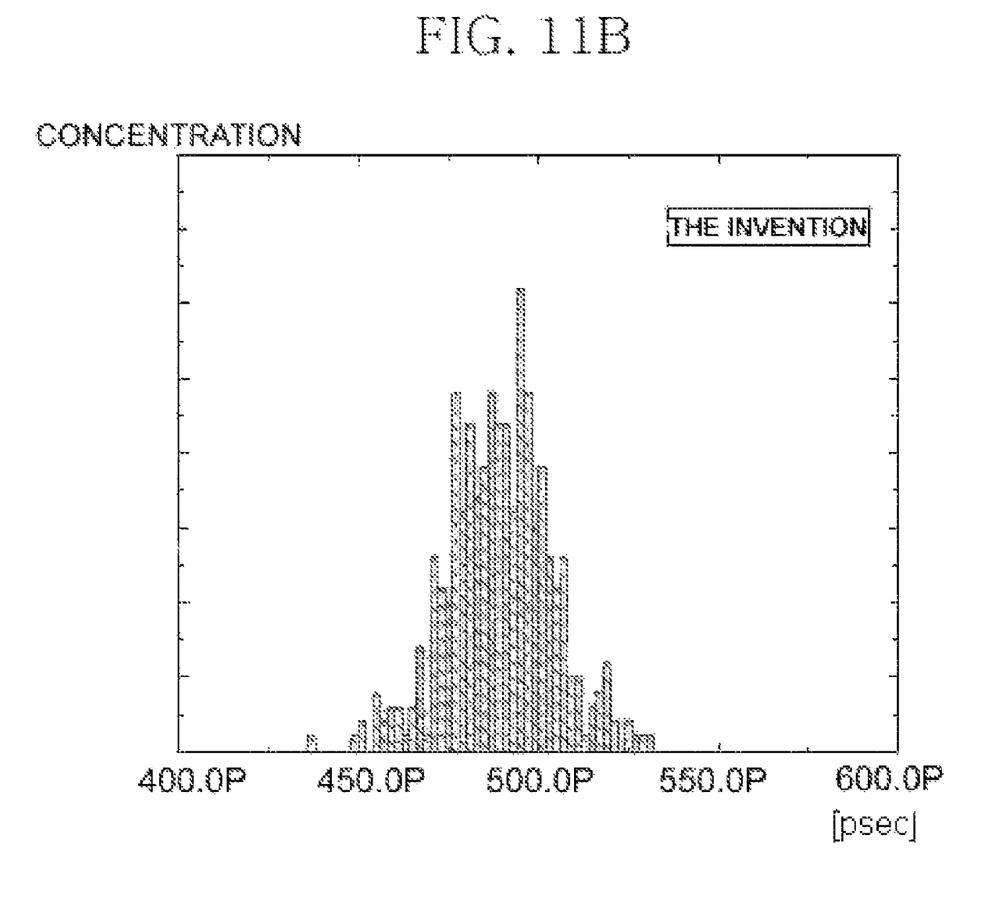

FIG. 11A shows the concentration of a period of the output clock signal 'clk_out' in a DLL circuit that does not use the frequency adjusting apparatus according to the embodiments described herein. FIG. 11B shows the concentration of a period of the output clock signal 'clk_out' in a DLL circuit that uses the frequency adjusting apparatus according to the embodiments described herein. Here, the rated cycle of the output clock signal 'clk_out' is 500 psec.

Specifically, FIG. 11A shows that the period of the output clock signal 'clk_out' concentrates on the rated cycle 500 psec, and FIG. 11B shows that the period of the output clock signal 'clk_out' is de-concentrated from the rated cycle 500 psec. The more the clock signal cycle concentrates on the rated cycle, as illustrated in FIG. 11A, the more the occurrence of electromagnetic interference. In contrast, when the clock signal cycle is de-concentrated from the rated cycle, as illustrated in FIG. 11B, the occurrence of electromagnetic interference is reduced.

Figure 12:
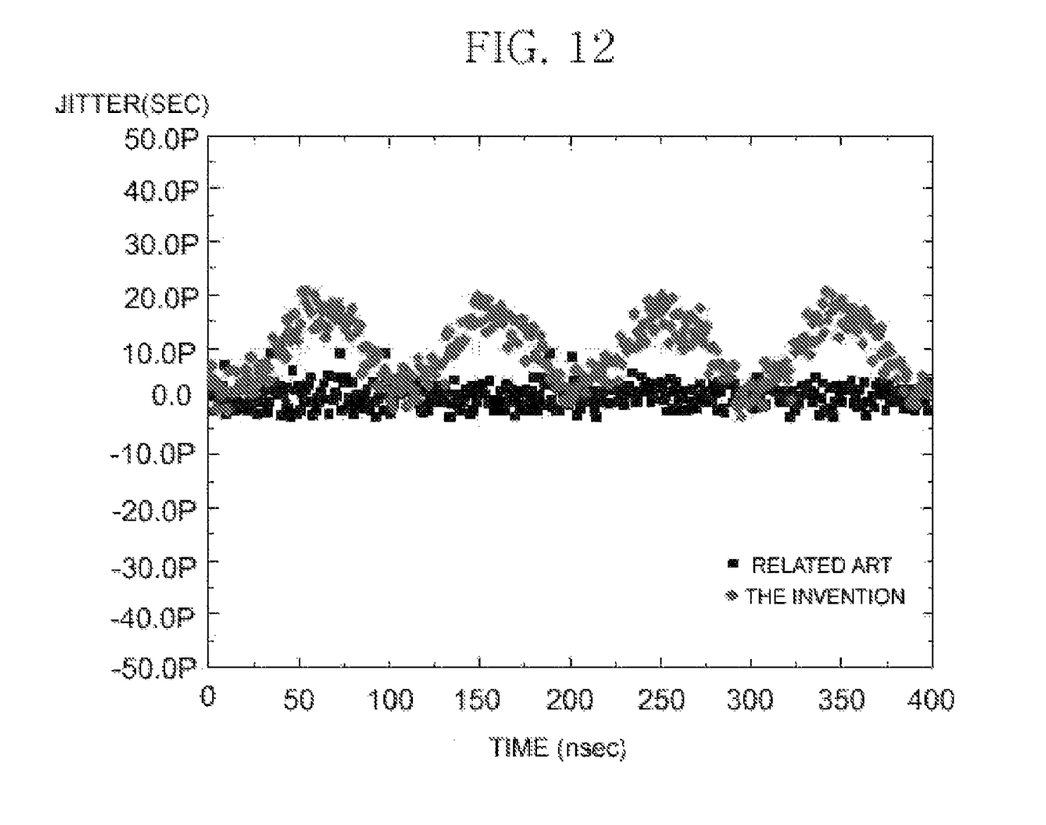

FIG. 12 shows an observation result of a jitter characteristic of a clock signal as time lapses. FIG. 12 illustrated that as compared to clock signal in a conventional DLL circuit, a clock signal in a DLL circuit configured as described herein, i.e., a DLL circuit that uses a frequency adjusting apparatus configured as described above, has a large amount of jitter.

As described above, the frequency adjusting apparatus as described herein and the DLL circuit including the same cyclically increases or decreases the frequency of the reference clock signal, such that the output clock signal does not have an accurate rated cycle. Therefore, the occurrence of electromagnetic interference in the DLL circuit and the semiconductor integrated circuit can be prevented, or at least reduced. As a result, the stable operation of the semiconductor integrated circuit can be supported.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A DLL (Delay Locked Loop) circuit, comprising:
a frequency adjusting apparatus configured to cyclically increase or decrease the frequency of a reference clock signal, thereby generating a frequency-adjusted clock signal;
a delay apparatus coupled with the frequency adjusting apparatus, the delay apparatus configured to delay the frequency-adjusted clock signal in response to a delay control signal, thereby generating a delayed clock signal;
a delay compensating apparatus coupled with the delay apparatus, the delay compensating apparatus configured to apply a delay time, which is obtained by modeling a delay amount on an output path of the delayed clock signal, to the delayed clock signal, thereby generating a feedback clock signal;
a phase comparing apparatus coupled with the delay compensating apparatus, the phase comparing apparatus configured to compare the phase of the reference clock signal with the phase of the feedback clock signal, thereby generating a phase comparison signal; and
a delay control apparatus coupled with the phase comparing apparatus, the delay control apparatus configured to generate the delay control signal in response to the phase comparison signal, wherein
the frequency adjusting apparatus includes:
a clock signal dividing unit configured to divide the frequency of the reference clock signal to generate a divided clock signal;
a frequency control signal generating unit configured to generate a multi-bit frequency control signal, which is changed in level bit by bit, in response to the divided clock signal; and
a frequency adjusting unit configured to adjust the frequency of the reference clock signal in response to the multi-bit frequency control signal and generate the frequency-adjusted clock signal.

2. The DLL circuit of claim 1, wherein the frequency control signal generating unit is configured to cyclically increase or decrease the number of high-level signals in the multi-bit frequency control signal in synchronization with the toggle timing of the divided clock signal.

3. The DLL circuit of claim 1, wherein the frequency adjusting unit cyclically is configured to increase or decrease a delay time to be applied to the reference clock signal according to a cyclical change in the logical value of the frequency control signal.

4. The DLL circuit of claim 1, further comprising a clock signal input buffer configured to buffer an external clock signal and generate the reference clock signal.

5. A DLL (Delay Locked Loop) circuit, comprising:
a frequency adjusting apparatus configured to cyclically increase or decrease the frequency of a reference clock signal, thereby generating a frequency-adjusted clock signal;
a delay apparatus coupled with the frequency adjusting apparatus, the delay apparatus configured to delay the frequency-adjusted clock signal in response to a delay control signal, thereby generating a delayed clock signal;
a delay compensating apparatus coupled with the delay apparatus, the delay compensating apparatus configured to apply a delay time, which is obtained by modeling a delay amount on an output path of the delayed clock signal, to the delayed clock signal, thereby generating a feedback clock signal;
a phase comparing apparatus coupled with the delay compensating apparatus, the phase comparing apparatus configured to compare the phase of the reference clock signal with the phase of the feedback clock signal, thereby generating a phase comparison signal; and a delay control apparatus coupled with the phase comparing apparatus, the delay control apparatus configured to generate the delay control signal in response to the phase comparison signal, wherein the frequency adjusting apparatus includes:
- a frequency control signal generating unit configured to divide the frequency of the reference clock signal by a plurality of division ratios to generate a multi-bit frequency control signal; and
- a frequency adjusting unit configured to adjust the frequency of the reference clock signal in response to the multi-bit frequency control signal.

6. The DLL circuit of claim 5, wherein the frequency control signal generating unit is configured to generate the multi-bit frequency control signal, which is cyclically changed in logical value bit by bit, in response to the reference clock signal.

7. The DLL circuit of claim 5, wherein the frequency adjusting unit cyclically is configured to increase or decrease a delay time to be applied to the reference clock signal according to a cyclical change in the logical value of the frequency control signal.

8. The DLL circuit of claim 5, further comprising a clock signal input buffer configured to buffer an external clock signal and generate the reference clock signal.

* * * * *